United States Patent [19]
Gardner et al.

[11] Patent Number: 5,990,493
[45] Date of Patent: Nov. 23, 1999

[54] DIAMOND ETCH STOP RENDERED CONDUCTIVE BY A GAS CLUSTER ION BEAM IMPLANT OF TITANIUM

[75] Inventors: Mark I. Gardner, Cedar Creek; Mark C. Gilmer, Austin, both of Tex.

[73] Assignee: Advanced Micro Devices, Inc., Sunnyvale, Calif.

[21] Appl. No.: 09/078,829

[22] Filed: May 14, 1998

[51] Int. Cl.$^6$ ............ H01L 31/0312; H01L 29/76; H01L 29/94; H01L 31/062
[52] U.S. Cl. ............ 257/77; 257/382; 257/383; 257/384; 257/607; 257/763; 257/764
[58] Field of Search ............ 257/77, 382, 383, 257/384, 607, 763, 764

[56] References Cited

U.S. PATENT DOCUMENTS

| | | |
|---|---|---|
| 4,120,700 | 10/1978 | Morimoto . |
| 4,559,096 | 12/1985 | Friedman et al. . |
| 4,929,489 | 5/1990 | Dreschhoff et al. . |
| 5,070,046 | 12/1991 | Hu . |
| 5,111,355 | 5/1992 | Anand et al. . |
| 5,142,438 | 8/1992 | Reinberg et al. . |
| 5,186,718 | 2/1993 | Tepman et al. . |
| 5,246,884 | 9/1993 | Jaso et al. . |
| 5,281,554 | 1/1994 | Shimada et al. . |
| 5,304,503 | 4/1994 | Yoon et al. . |
| 5,552,337 | 9/1996 | Kwon et al. . |
| 5,623,157 | 4/1997 | Miyazaki et al. ............ 257/383 |
| 5,677,015 | 10/1997 | Hasegawa . |
| 5,818,092 | 10/1998 | Bai et al. ............ 257/388 |
| 5,918,130 | 6/1999 | Hause et al. ............ 257/384 |

OTHER PUBLICATIONS

Huang, et al, "The Influence of Ge–Implantation on the Electrical Characteristics of the Ultra–Shallow Junction Formed by Using Silicide as a Diffusion Source," IEEE Electron Device Letters, vol. 17, No. 3, Mar. 1996, pp. 88–90.

Yamada et al. "Gas Cluster Ion Beam Processing for ULSI Fabrication," Reprinted from Materials Research Society Symposium Proceedings vol. 427, *Advanced Metallization for Future ULSI*.

Raaijamakers "Low Temperature Metal—Organic Chemical Vapor Deposition of Advanced Barrier Layers for the Microelectronics Industry," *Thin Solid Films*, 247 (1994) pp. 85–93.

*Primary Examiner*—Ngân V. Ngô
*Attorney, Agent, or Firm*—Kevin L. Daffer; Conley, Rose & Tayon

[57] ABSTRACT

A method if provided for forming a diamond etch stop layer across a transistor to protect the source and drain junctions and the gate conductor of the transistor from being etched. The diamond may be CVD deposited from a hydrocarbon-bearing gas across the transistor. An interlevel dielectric comprising oxide is formed across the diamond etch stop layer. Contact openings may be etched through the oxide interlevel dielectric to the source and drain junctions and the gate conductor using a fluorine-bearing plasma. Advantageously, a high etch rate selectivity of oxide to diamond may be achieved using the fluorine-bearing plasma. As such, the plasma etch may be terminated well before significant portions of the diamond can be removed. Ti atoms may be implanted into regions of the diamond exposed by the contact openings and subsequently heated to render those regions of the diamond conductive. Contacts may be formed within the contact openings upon the conductive diamond which are electrically linked to the source and drain junctions and the gate conductor.

7 Claims, 6 Drawing Sheets

DIAMOND ETCH STOP RENDERED CONDUCTIVE BY A GAS CLUSTER ION BEAM IMPLANT OF TITANIUM

BACKGROUND OF THE INVENTION

1. Field of the Invention

This invention relates to integrated circuit fabrication and, more particularly, to using diamond as an etch stop layer during contact formation. The diamond is rendered conductive by incorporating titanium dopants within the diamond using gas cluster ion beam implantation.

2. Description of the Related Art

Fabrication of an integrated circuit involves numerous processing steps. After impurity regions have been placed within a silicon-based substrate and gate areas defined upon the substrate, an interlevel dielectric is formed across the topography to isolate the gate areas and the impurity regions. Interconnect routing is then placed across the semiconductor topography and connected to the impurity regions and/or the gate areas by ohmic contacts formed through the interlevel dielectric. The entire process of making ohmic contacts to the impurity regions and/or the gate areas and routing interconnect material between the ohmic contacts is described generally as "metallization". As the complexity of integrated circuits has increased, the complexity of the metallization composition has also increased. Conductive materials other than metal are commonly used for metallization. As such, the term metallization is generic in its application.

Integrated circuits typically employ active devices known as transistors. A transistor includes a pair of impurity regions, i.e., junctions, laterally separated by a gate conductor which is dielectrically spaced above the substrate within which the junctions reside. The junctions contain a dopant species opposite in type to that of a channel region residing underneath the gate conductor. Formation of an ohmic contact through an interlevel dielectric to a junction involves patterning a protective mask upon areas of the interlevel dielectric exclusive of where the ohmic contact is to be formed. The area of the interlevel dielectric left uncovered by the mask is then etched to form an opening or window directly above the junction to which contact is to be made. The contact window is then filled with a conductive material to form a contact or plug electrically coupled to the junction. Unfortunately, the mask, and hence the contact, may be misaligned with the junction, resulting in increased resistance at the interface between the contact and the junction.

Typically, contact windows are etched through the interlevel dielectric using a dry, plasma etch technique. Unfortunately, it may be difficult to achieve a high etch selectivity ratio of the interlevel dielectric material, e.g., silicon dioxide, relative to the silicon-based junctions. For example, the plasma etch conditions of silicon dioxide ("oxide") must be strictly controlled to ensure that silicon underlying the oxide ($SiO_2$) is not significantly removed. Otherwise, the depth of the silicon-based junctions may be reduced to the extent that metal subsequently deposited into the contact windows can "spike" entirely through the shallow junctions. As a result of the metal penetrating below the depth of the junctions into the bulk substrate, the junctions may experience large current leakage or even become electrically shorted. These problems may become paramount as junction depth continues to decrease to below 500 Å.

A plasma provided with a fluorocarbon, e.g., $CF_4$, and $O_2$ may be used to etch oxide, however, Si is etched more rapidly than oxide in a $CF_4$—$O_2$ plasma. While adding $H_2$ to the $CF_4$—$O_2$ plasma has been found to increase the $SiO_2$-to-Si etch rate selectivity, the exact process conditions required to achieve the maximum selectivity ratio varies for different etch reactors. Accordingly, several experimental etch trials must be performed to determine the optimum process conditions necessary to etch oxide at a much faster rate than silicon. Not only are the experimental trials time consuming, they are also costly, and thus add to the costs of an integrated circuit manufacturer.

Incorporating self-aligned, low resistivity silicide structures between the contact windows and the junctions have grown in popularity due to the problems associated with aligning contact windows to the junctions. The presence of the self-aligned suicides, i.e., "salicides" upon the junctions ensures that contact is made to the entire area of each junction. A salicide process involves depositing a refractory metal across the semiconductor topography, and then reacting the metal only in regions where a high concentration of silicon atoms are present. In this manner, salicides (e.g., $TiSi_2$) may be formed exclusively upon the silicon-based junctions and the upper surface of a polycrystalline silicon ("polysilicon") gate conductor interposed between the junctions. Salicide formed upon polysilicon is generally referred to as "polycide". Regions between the junctions and the sidewall surfaces of the gate conductor may be pre-disposed with dielectric sidewall spacers generally formed from oxide. The sidewall spacers serve to prevent the metal deposited across the semiconductor topography from contacting, and hence reacting with, the polysilicon at the sidewall surfaces of the gate conductor. Absent the sidewall spacers, silicide could form upon the sidewall surfaces of the gate conductor, undesirably shorting the gate conductor to the adjacent junctions.

After salicides have been formed upon the junctions and the gate conductor of a transistor, an interlevel dielectric is deposited across the semiconductor topography. Contact windows are then etched through the interlevel dielectric and filled with a conductive material to form contacts to the salicides. Unfortunately, a high etch selectivity ratio of the interlevel dielectric material, e.g., oxide, relative to salicide may also be extremely difficult to accomplish. Therefore, substantial portions of the salicides may be removed during the overetch time allotted for plasma etching the contact windows. As a result, the resistance to the flow of current between the contacts and the junctions is increased. In the worst case, the entire thickness of the salicides may be etched, completely eliminating the benefits provided by the salicides. Tungsten (W) plugs are often formed within the contact windows using chemical-vapor deposition ("CVD"). The W is typically CVD deposited from a gas comprising $SiH_4$ and $WF_6$ or $WF_4$ at a temperature of 300 to 350° C. W deposition upon $TiSi_2$ structures may lead to the formation of an interfacial $TiF_3$ layer between the W and the $TiSi_2$. The $TiF_3$ layer undesirably increases the contact resistance between the W and the underlying salicides.

It would therefore be beneficial to devise a process for forming an ohmic contact to a junction of a transistor without being concerned with misalignment and overetch, resulting in undesirably high contact resistance at the junction. It would be beneficial to protect the junction from being etched during the formation of a contact opening through an overlying interlevel dielectric. Otherwise, the junction could become so shallow that conductive material deposited into the contact opening could penetrate entirely through the junction, causing current leakage from the junction. Further, if a salicide resides upon the junction, removal of the salicide must be prevented to ensure that the contact resistance remains as low as possible. Moreover, the W source (i.e., $WF_6$ or $WF_4$) used for the CVD deposition of W into the contact opening should be inhibited from contacting $TiSi_2$-type salicide, and thus forming $TiF_3$.

SUMMARY OF THE INVENTION

The problems outlined above are in large part solved by the technique hereof for forming a diamond etch stop layer across a transistor to protect the source and drain junctions and the gate conductor of the transistor from being etched. The junctions may be arranged within a silicon-based substrate, and a polysilicon gate conductor may be dielectrically spaced above a region of the substrate interposed between the junctions. The diamond may be CVD deposited from a hydrocarbon-bearing gas across the transistor. An interlevel dielectric comprising oxide is formed across the diamond etch stop layer to isolate the transistor from other integrated circuit devices. Contact openings may be etched through the oxide interlevel dielectric to the source and drain junctions and the gate conductor using a fluorine-bearing plasma. Advantageously, a high etch rate selectivity of oxide to diamond may be achieved using the fluorine-bearing plasma. As such, the plasma etch may be terminated well before significant portions of the diamond can be removed. Therefore, the diamond serves as an etch stop layer in that it etches at a significantly slower rate than the interlevel dielectric, and thus protects the structures underlying the diamond form being removed. In particular, the presence of the diamond etch stop layer upon the source and drain junctions provides protection against unwanted junction depth reduction.

In an embodiment, salicide (e.g., $TiSi_2$) structures are formed upon the source and drain junctions and the upper surface of the gate conductor prior to depositing the diamond etch stop layer across the salicide structures. The diamond etch stop layer serves to inhibit removal of the salicide structures as first, second, and third contact openings are etched through the interlevel dielectric to respective regions of the diamond residing directly above the source junction, the gate conductor, and the drain junction. The diamond etch stop layer also allows W to be CVD deposited into the contact openings without being concerned that $TiF_3$ might form upon $TiSi_2$ structures. The CVD diamond layer interposed between W and $TiSi_2$ somewhat acts as a barrier against $TiF_3$ formation. The barrier properties of CVD diamond helps ensure contact resistance between the W plug and the salicide structures is maintained at a relatively low value.

According to an embodiment, regions of the diamond etch stop layer exposed by the contact openings are implanted with Ti atoms prior to filling the contact openings with a conductive material. A 1 to 100 Å deep implant of the Ti atoms may be performed using gas cluster ion beam implantation to incorporate those atoms throughout the entire thickness (e.g., about 50 Å) of the diamond etch stop layer. Gas cluster ion beam implantation of Ti involves supercooling a gas comprising $TiCl_4$ by passing it through a super sonic expansion nozzle into a high vacuum chamber. As a result of being supercooled, cluster beams comprising hundreds to thousands of Ti atoms may be generated from the titanium-bearing gas. Those clusters of Ti atoms are then ionized to form cluster ion beams and passed through an ion accelerator, i.e., an electric field. The ion accelerator causes the ionized clusters of Ti atoms to gain energy as they are directed toward the diamond etch stop layer. As the ionized clusters of Ti atoms bombard the diamond, they separate into individual atoms which share the total energy of the corresponding cluster. Dividing the total energy of the cluster among individual Ti atoms results in the energy of each Ti atom being much lower than the entire cluster. In fact, the energy of each Ti atom may range from a few eV to hundreds of eV. The relatively low energy of the each Ti atom affords shallow implantation of the Ti atoms into exposed regions of the diamond etch stop layer.

Subsequent to implanting Ti atoms into the exposed regions of the diamond etch stop layer, a conductive material, such as W is deposited into the contact openings self-aligned to the implanted Ti atoms. The W layer is blanket deposited into the contact openings to a level spaced above the uppermost surface of the interlevel dielectric. The upper surface of the conductive material may then be removed down to a level substantially coplanar with the uppermost surface of the interlevel dielectric using, e.g., chemical-mechanical polishing. In this manner, contacts or plugs are formed within the contact openings upon doped regions of the diamond etch stop layer. Thereafter, the semiconductor topography may be heated to a temperature of approximately 800° C. to activate and position the Ti dopants residing within the diamond etch stop layer. As a result of the anneal step, the resistivity of the diamond is lowered, changing the diamond from an insulator to a conductor. Thus, the now-conductive regions of the diamond etch stop layer electrically link the contacts to the salicide structures, and hence to the source and drain junctions and the gate conductor. In an alternate embodiment, the regions of the diamond residing upon the salicide structures are removed using a high temperature oxidation of the diamond or a H plasma etch of the diamond.

BRIEF DESCRIPTION OF THE DRAWINGS

Other objects and advantages of the invention will become apparent upon reading the following detailed description and upon reference to the accompanying drawings in which:

FIG. 6a depicts a partial cross-sectional view of the semiconductor topography, wherein Ti atoms are implanted into exposed regions of the diamond etch stop layer using gas cluster ion beam implantation, subsequent to the step in FIG. 5a;

FIG. 7a depicts a partial cross-sectional view of a semiconductor topography, wherein conductive plugs are formed within the contact openings, subsequent to the step in FIG. 6a;

FIG. 8a depicts a partial cross-sectional view of the semiconductor topography, wherein the topography is heated to activate and position the implanted Ti atoms, and thereby render the implanted regions of the diamond etch stop layer conductive, subsequent to the step in FIG. 7a.

Figure 1:
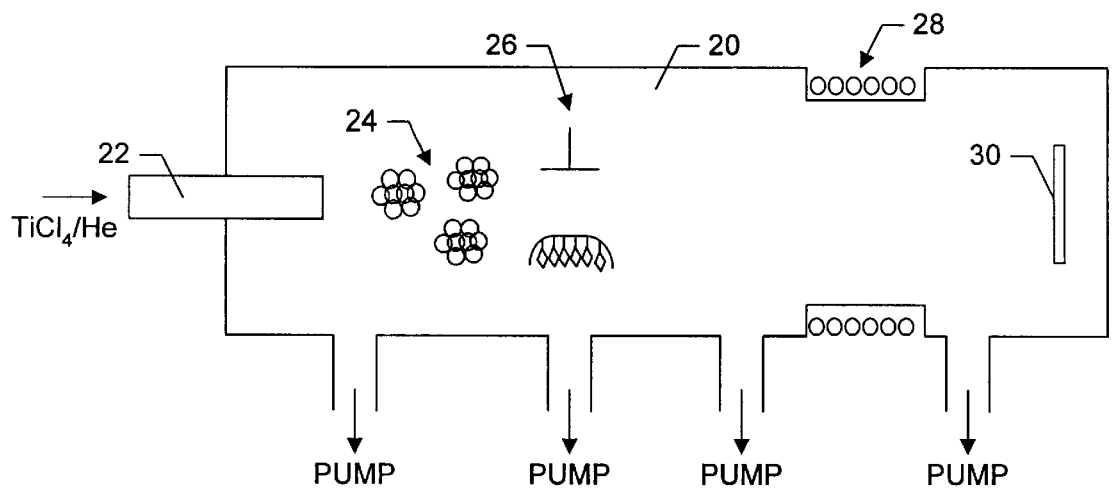
FIG. 1 depicts a side plan view of a cluster ion beam implantation system which may be used to implant atoms to a relatively shallow depth in a target material.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 depicts a side plan view of a cluster ion beam implantation system which may be used to perform shallow implantation of species into a target. The system includes a super sonic adiabatic expansion nozzle 22. Nozzle 22 passes into an implantation chamber 20 which is maintained at a low pressure of less than about 100 milliTorr (i.e., vacuum regime). Although not shown, nozzle 22 tapers radially such that its inner diameter decreases as it approaches the inner portion of implantation chamber 20. Several types of pumps, e.g., mechanical booster pumps, diffusion pumps, and turbo-molecular pumps, may be used to evacuate chamber 20. The implantation system also includes an ionizer 26 and an acceleration tube 28. The target 30 into which the ionic clusters are to be implanted is positioned on the opposite end of chamber 20 from nozzle 22 in preparation for the implantation process.

The implantation process involves passing a gas comprising the species to be implanted through nozzle 22 and into chamber 20. An inert gas, such as He may serve as the carrier gas. As shown, $TiCl_4$ may be passed into nozzle 22 to provide for the implantation of Ti atoms into target 30. As a result of being passed through nozzle 22, the gaseous molecules are supercooled, and thus become clusters of atoms 24, or collimated neutral cluster beams. Those clusters of atoms 24 are then ionized by electron bombardment within implantation chamber 20. Although not shown, a mass filter and a static lens system comprising several electrostatic field plates with small apertures may be positioned within chamber 20 between ionizer 26 and acceleration tube 28. The static lens system and the mass filter may be used to select the ionized clusters of Ti atoms for implantation while filtering out ionized clusters of Cl atoms. Those ionized clusters of Ti atoms are then electrostatically accelerated toward target 30 as they pass through acceleration tube 28 such that they gain energy. Upon striking target 30, the ionized clusters break up into individual Ti atoms. The total energy of each ionized cluster is uniformly distributed across its corresponding atoms. As such, each Ti atom has a low energy ranging from a few keV to hundreds of keV. The low energy of each Ti atom entering target 30 allows the atoms to be implanted at a shallow depth of approximately 1 to 100 Å below the topological surface of target 30. See, e.g., "Gas Cluster Ion Beam Processing For ULSI Fabrication", Yamada, I. and Matsuo, J., *Material Resources Society Symposium Proceedings,* Volume 427, pp. 265–274 (incorporated herein by reference) for a detailed description of gas cluster ion beam implantation.

Figure 2:
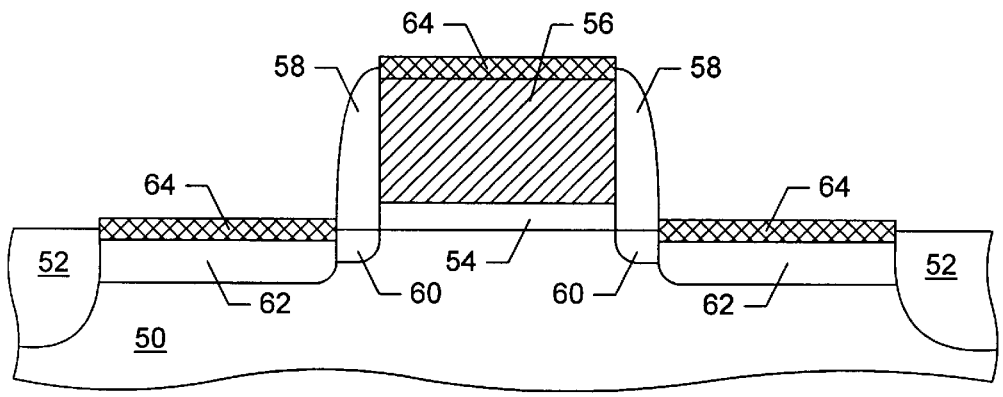
FIG. 2 depicts a partial cross-sectional view of a semiconductor topography in which a transistor is arranged upon and within a semiconductor substrate and salicide structures are formed upon the source and drain junctions and the gate conductor of the transistor.

Turning to FIG. 2, a partial cross-sectional view of a semiconductor substrate 50 is depicted. Substrate 50 comprises single crystalline silicon which has been slightly doped with n-type or p-type impurities. Trench isolation structures 52 are arranged a spaced distance apart within field regions of substrate 50. Trench isolation structures 52 serve to isolate ensuing active areas of substrate 50. Alternatively, trench isolation structures 52 may be replaced with well-known LOCOS structures. A gate dielectric 54 composed of, e.g., oxide or nitride, is arranged upon an ensuing channel region of substrate 54. A polysilicon gate conductor 56 is spaced above substrate 50 by gate dielectric 54. Dielectric sidewall spacers 58 extend laterally from the opposed sidewall surfaces of gate conductor 56. Lightly doped drain ("LDD") areas 60 are arranged directly beneath sidewall spacers 58 within substrate 50. Source and drain regions 62 are positioned within substrate 50 laterally between LDD areas 62 and field isolation structures 52. Source and drain regions 62 and LDD areas 60 form graded junctions within substrate 50 which increase in dopant concentration in a lateral direction away from gate conductor 56. In an alternate embodiment, LDD areas 60 and source and drain regions 62 may reside within a p-type or n-type well formed in substrate 50. Such well regions provide for the formation of a CMOS integrated circuit having both NMOSFET and PMOSFET transistors. Salicide structures 64 comprising, e.g., $TiSi_2$ or $CoSi_2$, have been formed upon source and drain regions 62 and the upper surface of gate conductor 56 using conventional techniques.

Figure 3:
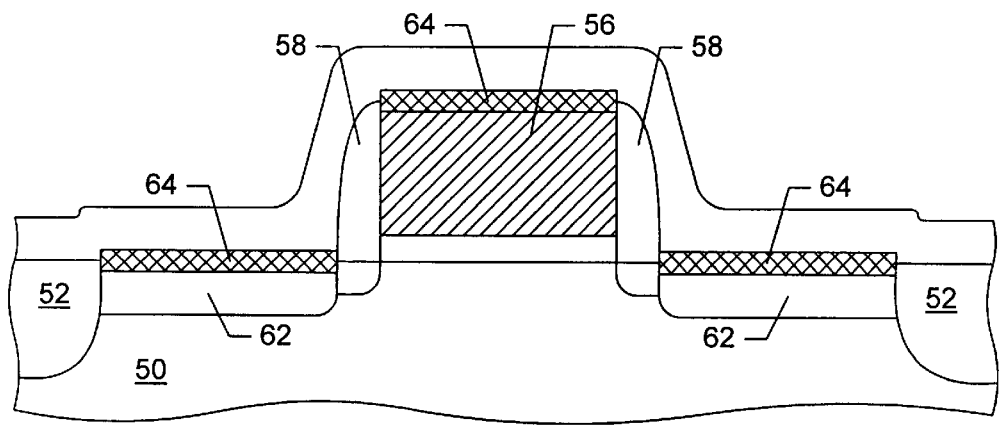
FIG. 3 depicts a partial cross-sectional view of the semiconductor topography, wherein a diamond etch stop layer is CVD deposited across the topography, subsequent to the step in FIG. 2.
Figure 4:
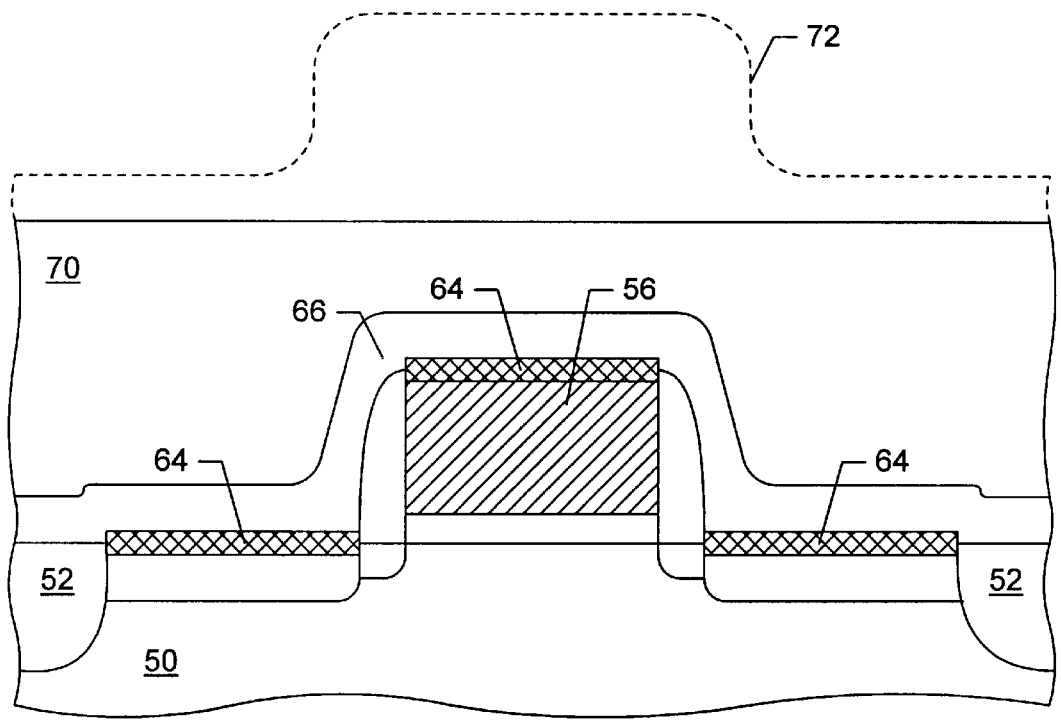
FIG. 4 depicts a partial cross-sectional view of the semiconductor topography, wherein an interlevel dielectric having a substantially planar upper surface is deposited across the diamond etch stop layer, subsequent to the step in FIG. 3.

According to a preferred embodiment, a diamond etch stop layer 66 having a thickness of, e.g., about 50 Å is CVD deposited across the semiconductor topography, as shown in FIG. 3. Diamond etch stop layer 66 is deposited from a gas comprising a fluorocarbon, e.g., methyl amine, at a temperature greater than about 700° C. It is believed that diamond formed in this manner is crystalline in form. Turning to FIG. 4, an interlevel dielectric 70 is then formed across diamond etch stop layer 66. Interlevel dielectric 70 is formed by first CVD depositing a dielectric, e.g., oxide, across the topography, as indicated by dotted line 72. The upper surface of interlevel dielectric 70 is then planarized using, e.g., chemical-mechanical polishing.

Figure 5A:
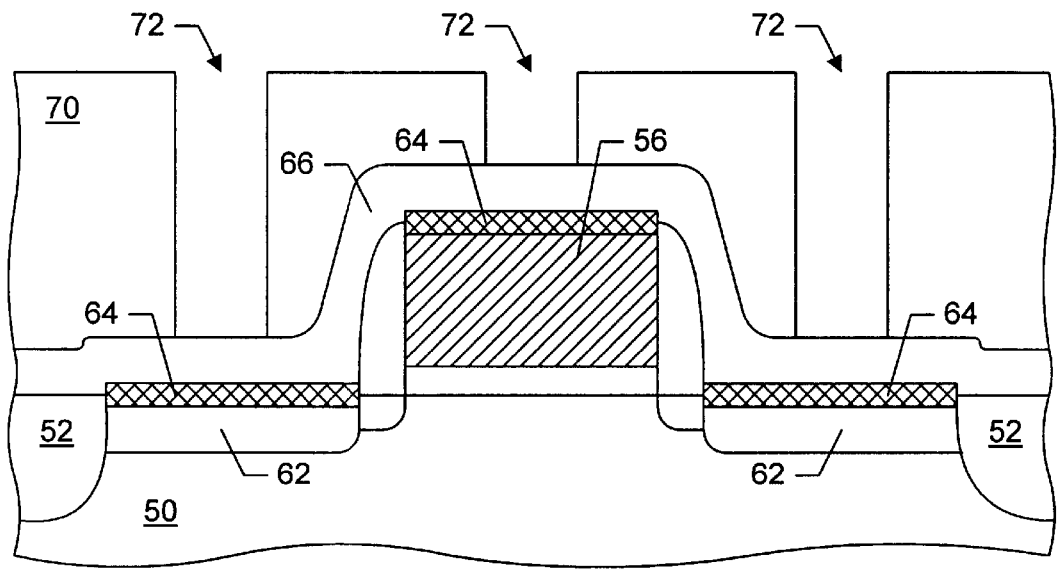
FIG. 5a depicts a partial cross-sectional view of the semiconductor topography according to one embodiment, wherein contact openings are etched vertically through the interlevel dielectric to the diamond etch stop layer, subsequent to the step in FIG. 4.

FIGS. 5a, 6a, 7a, and 8a depict one sequence of steps to be performed upon the topography depicted into FIG. 4, while FIGS. 5b, 6b, 7b, and 8b depict another sequence of steps. FIG. 5a illustrates the formation of contact openings 72 through interlevel dielectric 70 to regions of diamond etch stop layer 66 arranged directly above source and drain regions 62 and gate conductor 56. Contact openings 72 are etched using a plasma etch technique that exhibits a high selectivity for the dielectric relative to diamond. Although not shown, portions of interlevel dielectric 70 that are not to be etched are protected by a masking layer, e.g., lithographically patterned photoresist, during the plasma etch process. For example, if interlevel dielectric 70 primarily comprises oxide, unmasked portions of interlevel dielectric 70 may be etched using a plasma provided with a fluorocarbon, e.g., $CF_4$ and $O_2$. The etch rate of interlevel dielectric 70 is substantially greater than that of diamond etch stop layer 66 using such a plasma. Consequently, those unmasked portions of interlevel dielectric 70 may be overetched to ensure complete removal from diamond etch stop layer 66 without being concerned that excessive removal of the etch stop layer might occur. Therefore, the presence of diamond etch stop layer 66 upon salicide structures 64 substantially inhibits the salicide structures from being etched. Terminating the plasma etch immediately after the etch duration has exceeded a pre-selected length of time is thus no longer critical to contact formation.

Although FIG. 5b also depicts the formation of contact openings 72 through interlevel dielectric 70, it additionally illustrates an upper surface of a portion 73 of interlevel dielectric 70 being removed to a level spaced below the upper surface of the other portions of interlevel dielectric 70. That portion 73 is interposed between an adjacent pair of the contact openings 72. The upper surface of portion 73 may be lowered by first patterning a masking layer across portions of interlevel dielectric 70 exclusive of portion 73. Portion 73 is plasma etched subsequent to and in the same manner as contact openings 72. However, the etch duration is chosen to terminate before all of portion 73 of interlevel dielectric 70 is removed from above diamond etch stop layer 66. Preferably, at least 100 Å of portion 73 are retained upon diamond etch stop layer 66.

Figure 5B:
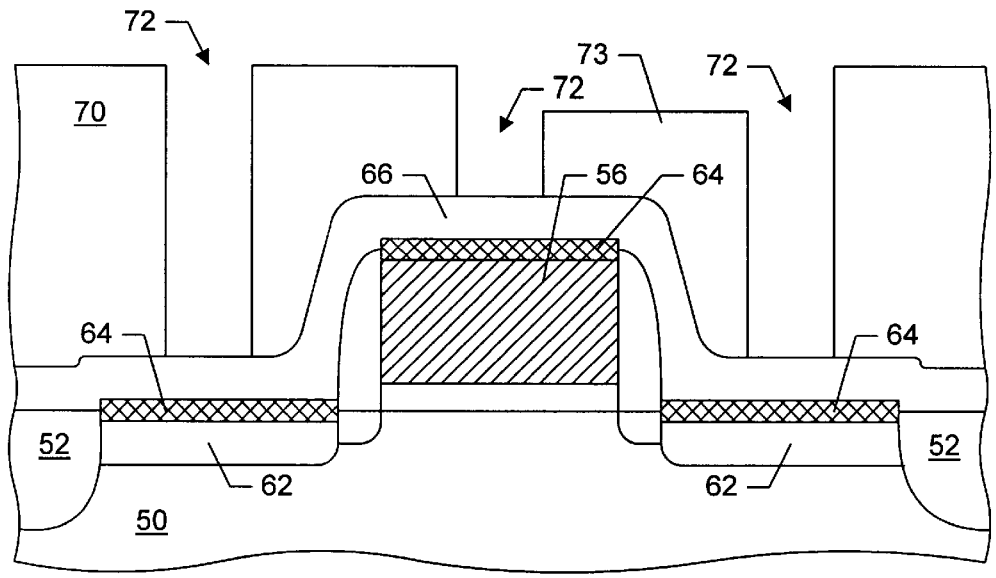
FIG. 5b depicts a partial cross-sectional view of the semiconductor topography according to another embodiment, wherein contact openings are etched vertically through the interlevel dielectric to the diamond etch stop layer, and a trench is etched horizontally between two of the contact openings, subsequent to the step in FIG. 4.
Figure 6A:
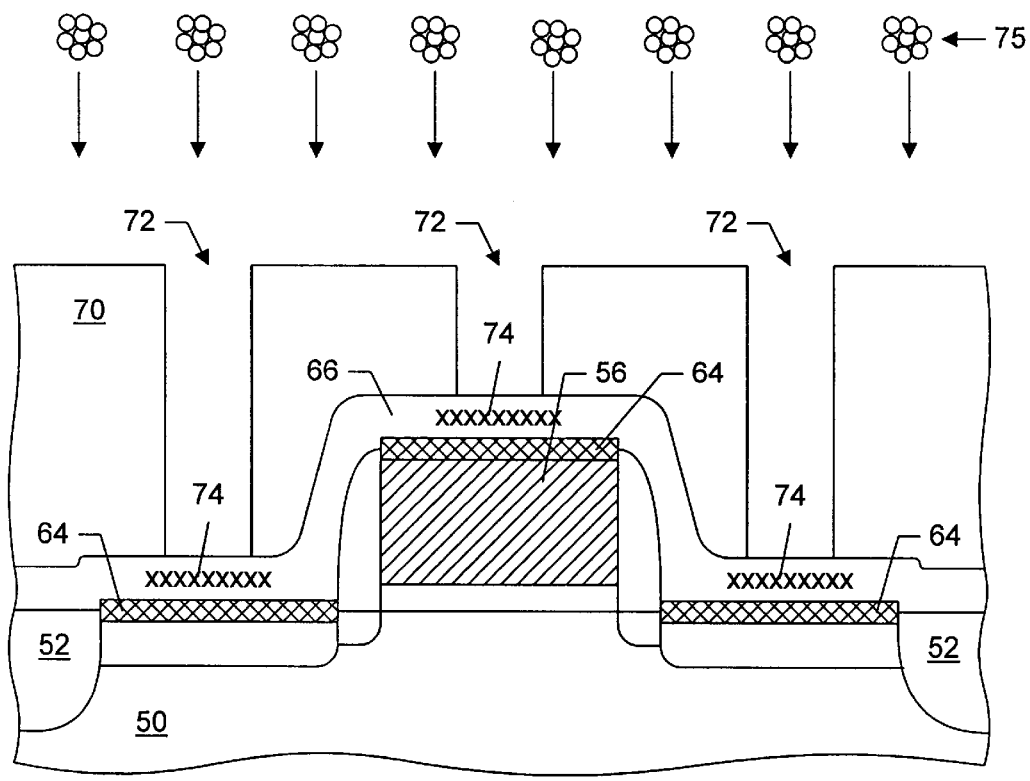
Figure 6B:
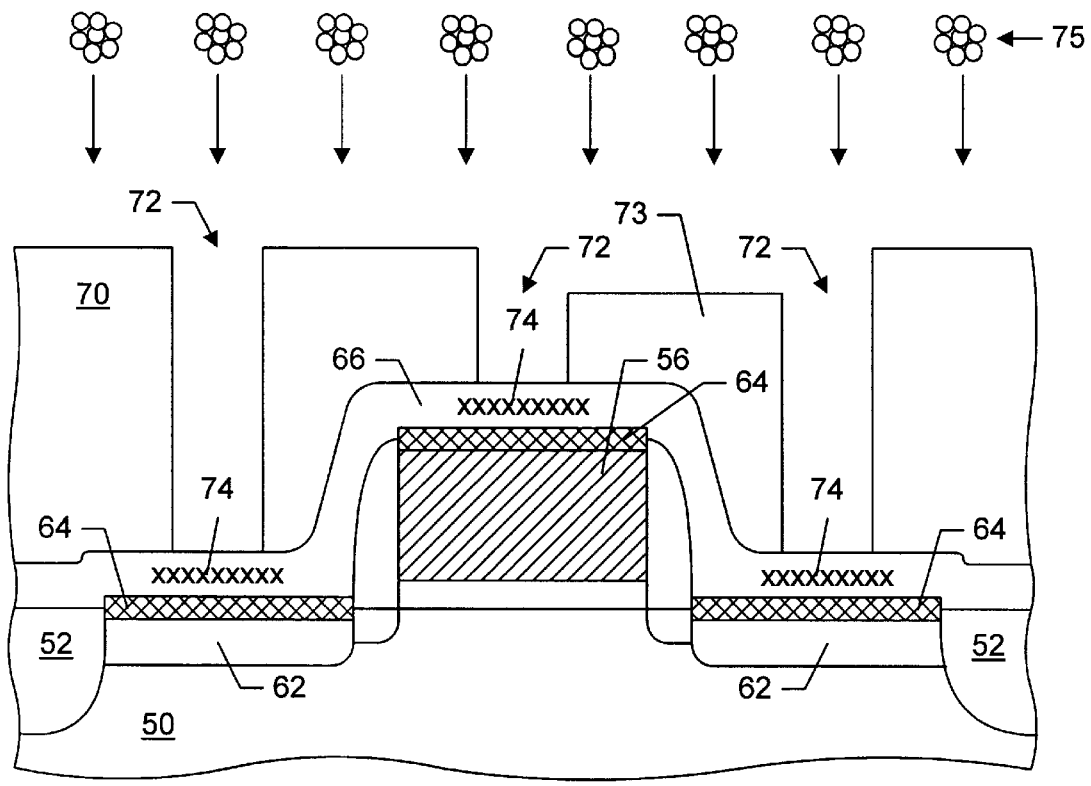
FIG. 6b depicts a partial cross-sectional view of the semiconductor topography, wherein Ti atoms are implanted into exposed regions of the diamond etch stop layer using gas cluster ion beam implantation, subsequent to the step in FIG. 5b.

FIGS. 6a and 6b depict the semiconductor topographies formed in FIGS. 5a and 5b, respectively, being subjected to a gas cluster ion beam implant of ionized clusters of Ti atoms 75. The implantation chamber shown in FIG. 1 is used for the gas cluster ion beam implant. A Ti-containing molecule, e.g., $TiCl_4$, may be fed into the implantation chamber to be transformed into ionized clusters of atoms. Only clusters of Ti atoms 75 are permitted to pass through the acceleration tube of the implanter to the semiconductor topography. Ti atoms are thusly placed into exposed regions 74 of diamond etch stop layer 66. The depth of implantation below the upper surface of diamond etch stop layer 66 may be, e.g., 1 to 100 Å. As a result of the implant, Ti atoms are incorporated throughout exposed regions 74 of the diamond etch stop layer 66.

Figure 7A:
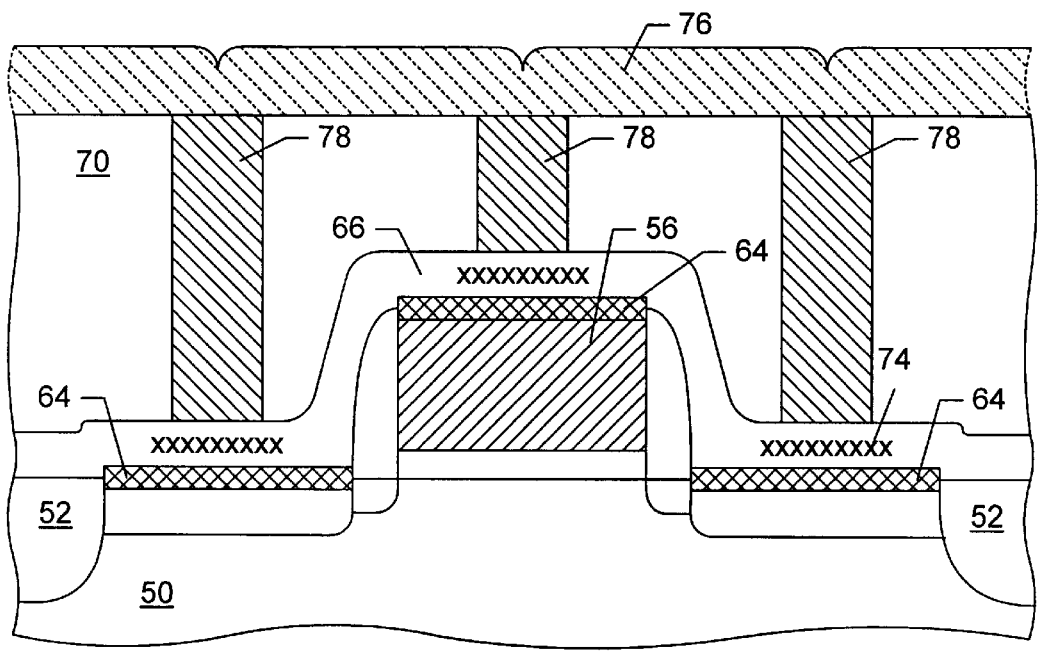

Turning to FIG. 7a, conductive contacts 78 are formed within contact openings 72, subsequent to the step depicted in FIG. 6a. Conductive contacts 78 may be fabricated by depositing a conductive material, e.g., W, into contact openings 72 to a level spaced above the upper surface of interlevel dielectric 78. A portion 76 of the conductive material is then removed using, e.g., chemical-mechanical polishing, to complete the formation of conductive contacts 78. The resulting surfaces of contacts 78 are substantially coplanar with the upper surface of interlevel dielectric 70. Conductors which abut contacts 78 may subsequently be formed horizontally across interlevel dielectric 70, electrically interconnecting contacts 78 and other distal structures of the integrated circuit.

Figure 7B:
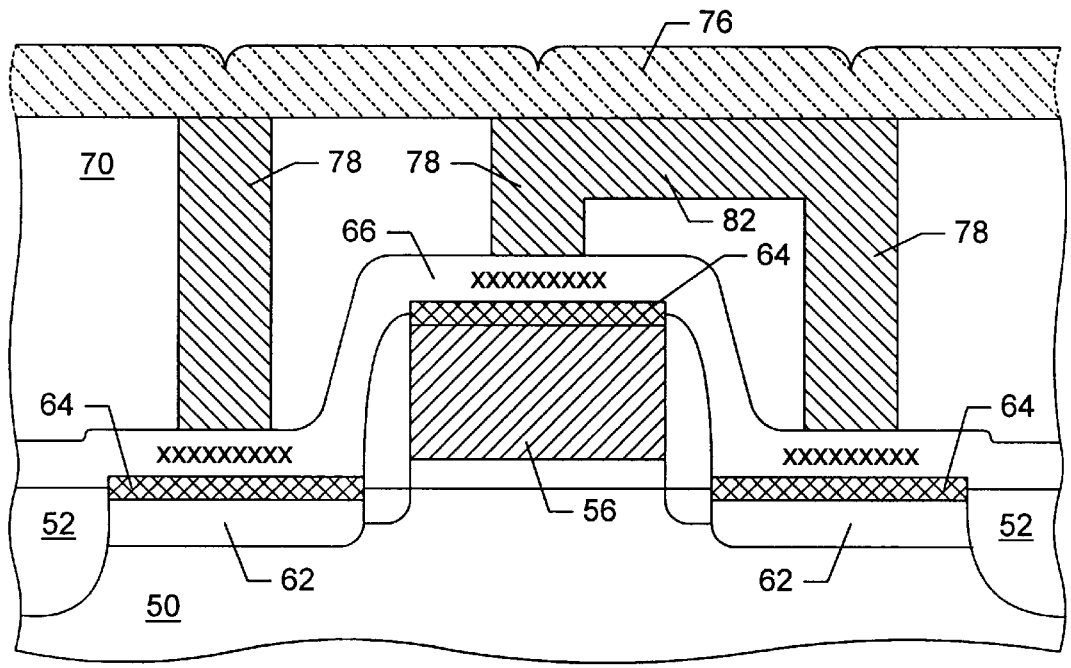
FIG. 7b depicts a partial cross-sectional view of a semiconductor topography, wherein conductive contacts are formed within the contact openings and a local interconnect is formed within the trench extending between two of the contact openings, subsequent to the step in FIG. 6b.

FIG. 7b illustrates the formation of conductive contacts 78 within contact openings 72 and a local interconnect 82 between adjacent contacts 78, upon portion 73 of interlevel dielectric 70. Formation of conductive contacts 78 and local interconnect 82 involves the deposition of a conductive material, e.g., polysilicon or W, across the topography to a level spaced above the uppermost surface of interlevel dielectric 70. A portion 76 of the conductive material is then etched to a level substantially commensurate with the uppermost surface of interlevel dielectric 70. Local interconnect 82 extends a relatively short distance between a pair of adjacent contacts 78 formed directly above gate conductor 56 and one of the source and drain regions 62. Interconnect 82 electrically couples gate conductor 56 with one junction 62. Coupling the gate to the one junction causes a diode to exist relative to the other junction. Although not shown, a distally extending conductor, i.e., interconnect, may subsequently be formed in electrical communication with the contact 78 not coupled to local interconnect 82.

Figure 8A:
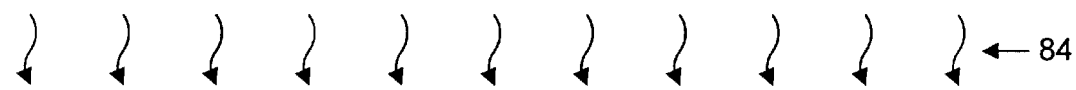
Figure 8A:
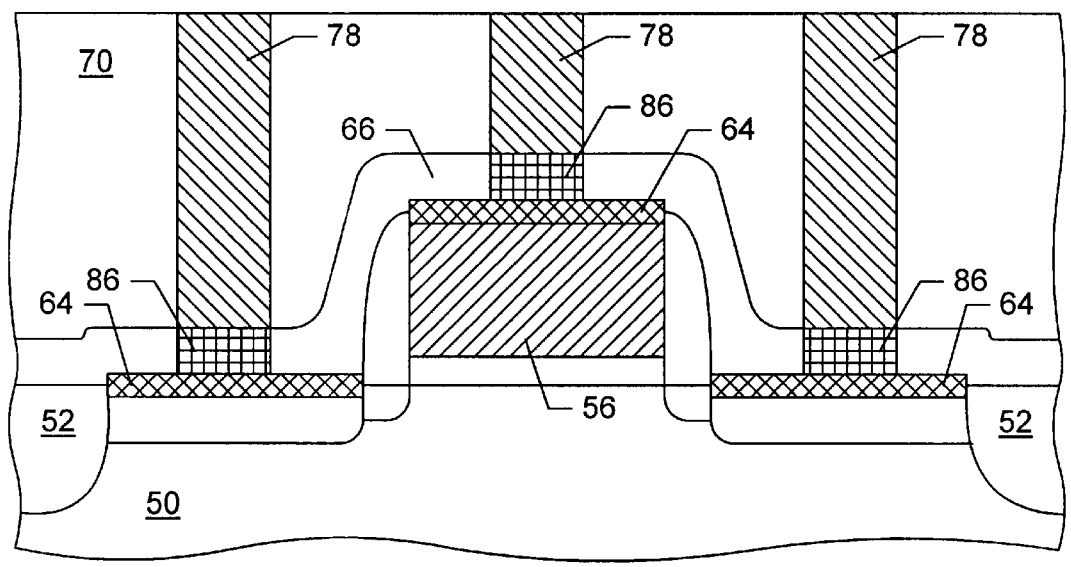
Figure 8B:
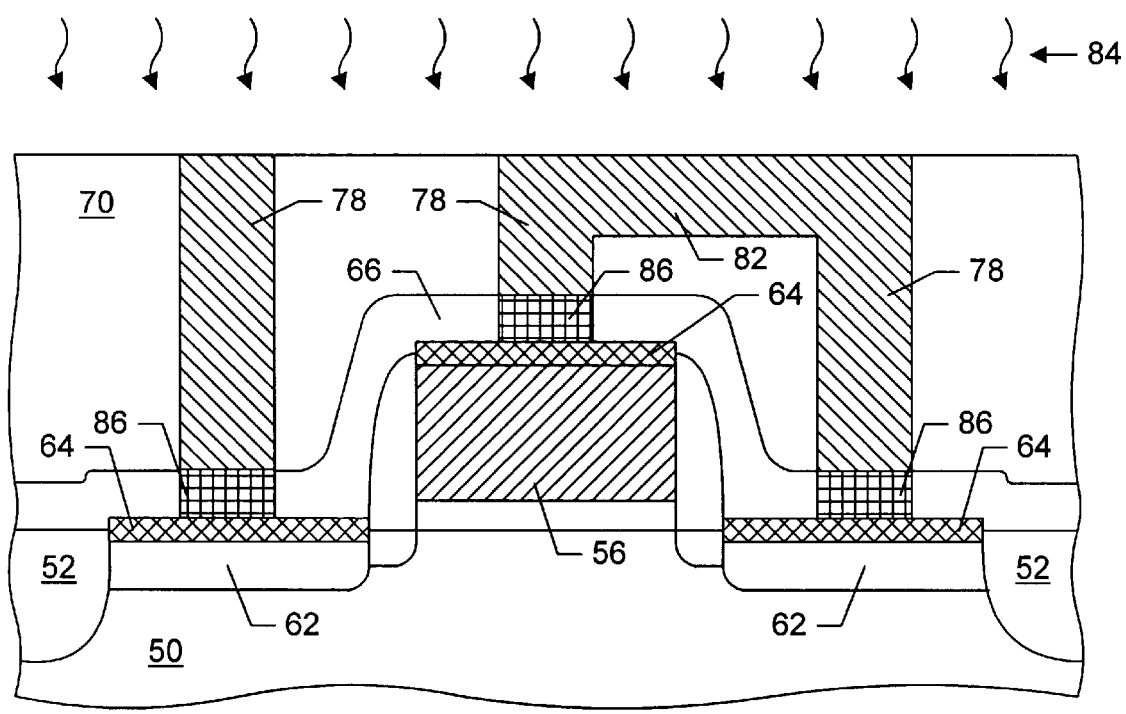
FIG. 8b depicts a partial cross-sectional view of the semiconductor topography, wherein the topography is heated to activate and position the implanted Ti atoms, and thereby render the implanted regions of the diamond etch stop layer conductive, subsequent to the step in FIG. 7b.

Subsequent to the processing step depicted in FIGS. 7a and 7b, respectively, the semiconductor topography is subjected to radiation 84, as shown in respective FIGS. 8a and 8b. Radiation 84 heats the Ti atoms residing within regions of diamond etch stop layer 66 to a temperature of, e.g., 800° C. Radiation 84 is may be radiant light supplied from an arc lamp or a tungsten-halogen lamp using a technique known as rapid thermal processing ("RTP"). Alternatively, radiation 84 may be thermal radiation provided from a heated furnace. As a result of being heated, the Ti atoms residing within diamond etch stop layer 66 are activated and positioned, thereby lowering the resistivity of the Ti doped regions of diamond etch stop layer 66. In this manner, the Ti doped regions of diamond etch stop layer 66 are converted into conductive diamond structures 86. Conductive diamond structures 86 serve to electrically linked contacts 78 to salicide structures 64, which are coupled to source and drain regions 62 and gate conductor 56. Alternatively, diamond etch stop layer 66 may be removed from salicide structures 64 using, e.g., a high temperature oxidation process or a H plasma etch, prior to forming contacts 78. In an alternate embodiment, the Ti implanted regions of the diamond may be heated and made conductive prior to formation of contacts upon the implanted regions.

It will be appreciated to those skilled in the art having the benefit of this disclosure that this invention is believed to provide a method for using diamond as an etch stop layer during contact formation. Select portions of the diamond are rendered conductive by incorporating titanium dopants within those portions of the diamond using gas cluster ion beam implantation. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. An integrated circuit comprising a diamond etch stop layer residing upon a semiconductor topography for protecting the semiconductor topography from being etched, wherein the diamond etch stop layer comprises a first conductive region incorporated with Ti atoms.

2. The integrated circuit of claim 1, wherein the Ti atoms are arranged about 1 to 100 Å below an upper surface of the first conductive region of the diamond etch stop layer.

3. The integrated circuit of claim 2, wherein the Ti atoms are derived from ionized clusters of Ti atoms.

4. The integrated circuit of claim 3, wherein the semiconductor topography comprises a first source/drain region spaced from a second source/drain region by a gate conductor.

5. The integrated circuit of claim 4, wherein the first conductive region is arranged directly above the first source/drain region, and further comprising second and third conductive regions of the diamond etch stop layer residing directly above the gate conductor and the second source/drain region, respectively, wherein the second and third conductive regions are incorporated with Ti atoms.

6. The integrated circuit of claim 5, further comprising silicide structures residing upon the first and second source/drain regions and the gate conductor, underneath the first, second, and third conductive regions of the diamond etch stop layer.

7. The integrated circuit of claim 6, further comprising:

an interlevel dielectric arranged across the diamond etch stop layer; and conductive contacts extending vertically through the interlevel dielectric to the first, second, and third conductive regions.

* * * * *